(12) United States Patent
Fischer et al.

(10) Patent No.: US 9,076,897 B2
(45) Date of Patent: Jul. 7, 2015

(54) OPTOELECTRONIC SEMICONDUCTOR DEVICE AND METHOD FOR PRODUCING AN OPTOELECTRONIC SEMICONDUCTOR DEVICE

(75) Inventors: Helmut Fischer, Lappersdorf (DE); Andreas Plössl, Regensburg (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 14/001,310

(22) PCT Filed: Feb. 24, 2012

(86) PCT No.: PCT/EP2012/053213
§ 371 (c)(1),
(2), (4) Date: Oct. 1, 2013

(87) PCT Pub. No.: WO2012/113934
PCT Pub. Date: Aug. 30, 2012

(65) Prior Publication Data
US 2014/0014977 A1     Jan. 16, 2014

(30) Foreign Application Priority Data
Feb. 24, 2011 (DE) .......................... 10 2011 012 262

(51) Int. Cl.
*H01L 33/02* (2010.01)
*H01L 31/18* (2006.01)
(Continued)

(52) U.S. Cl.
CPC ............ *H01L 33/02* (2013.01); *H01L 31/1896* (2013.01); *H01L 33/0079* (2013.01); *H01L 33/641* (2013.01); *H01S 5/0217* (2013.01); *H01S 5/02476* (2013.01); *H01L 31/06875* (2013.01); *H01L 31/1892* (2013.01);
(Continued)

(58) Field of Classification Search
CPC ........... H01L 2224/32245; H01L 2224/29339; H01L 2924/01047; H01L 33/0079; H01L 33/486; H01L 33/62; H01L 33/641; B22F 9/24
See application file for complete search history.

(56) References Cited

U.S. PATENT DOCUMENTS 5,391,257 A *   2/1995   Sullivan et al. ............... 438/458
5,589,403 A *   12/1996   Toyama et al. ................. 438/71
(Continued)

FOREIGN PATENT DOCUMENTS

EP    0 905 797     3/1999
EP    1 385 215     1/2004
(Continued)

OTHER PUBLICATIONS

Schnitzer, I. et al., "30% External; Quantum Efficiency from Surface Textured, Thin-Film Light-Emitting Diodes," *Appl. Phys. Letters*, Oct. 18, 1993, vol. 63, No. 16, pp. 2174-2176.
(Continued)

*Primary Examiner* — Evan Pert
*Assistant Examiner* — Gustavo Ramallo
(74) *Attorney, Agent, or Firm* — DLA Piper LLP (US)

(57) ABSTRACT

An optoelectronic semiconductor device includes an optoelectronic semiconductor layer sequence on a metal carrier element, which includes as a first component silver and as a second component a material having a lower coefficient of thermal expansion than silver, wherein the first and second components are intermixed in the metal carrier element.

15 Claims, 3 Drawing Sheets

(51) Int. Cl.
  *H01L 33/00* (2010.01)
  *H01L 31/0687* (2012.01)
  *H01L 31/02* (2006.01)
  H01L 33/64 (2010.01)
  H01S 5/02 (2006.01)
  H01S 5/024 (2006.01)
  H01S 5/022 (2006.01)

(52) U.S. Cl.
  CPC ........... *H01S 5/02272* (2013.01); *Y02E 10/544* (2013.01); *H01L 31/02* (2013.01); *H01L 31/18* (2013.01); *H01L 2924/0002* (2013.01)

(56) References Cited

U.S. PATENT DOCUMENTS

| | | | | |
|---|---|---|---|---|
| 6,562,643 | B2* | 5/2003 | Chen | 438/26 |
| 6,797,990 | B2* | 9/2004 | Udagawa | 257/102 |
| 6,835,962 | B2* | 12/2004 | Udagawa | 257/97 |
| 7,033,858 | B2* | 4/2006 | Chai et al. | 438/106 |
| 8,163,581 | B1* | 4/2012 | Or-Bach et al. | 438/39 |
| 8,283,215 | B2* | 10/2012 | Or-Bach et al. | 438/149 |
| 2005/0093146 | A1* | 5/2005 | Sakano | 257/730 |
| 2005/0214979 | A1* | 9/2005 | Suzuki et al. | 438/118 |
| 2007/0096114 | A1* | 5/2007 | Aoki et al. | 257/79 |
| 2007/0262341 | A1* | 11/2007 | Liu et al. | 257/103 |
| 2008/0277674 | A1* | 11/2008 | Nagai et al. | 257/88 |
| 2011/0062481 | A1* | 3/2011 | Oyamada | 257/98 |
| 2012/0112236 | A1* | 5/2012 | Higuma et al. | 257/98 |

FOREIGN PATENT DOCUMENTS

| | | |
|---|---|---|
| EP | 2 479 806 | 7/2012 |
| WO | 02/13281 | 2/2002 |
| WO | 2011/034080 | 3/2011 |

OTHER PUBLICATIONS

Rabkin, V.B. et al., "Power Metallurgy and Metal Ceramics," *Metallurgiya*, 1968, vol. 7, No. 3, pp. 210-215 (translated from Poroshkovaya Metallurgiya, 1968, No. 3, No. 63, pp. 64-70).

Graph taken from Massalski, "Binary Alloy Phase Diagrams," *ASM International*, 1 page.

Stolk, J. et al., "Chemical Synthesis and Characterization of Low Thermal Expansion-High Conductivity Cu—Mo and Ag—Mo Composites," *Metallurgical and Materials Transactions*, Sep. 2000, vol. 31A, pp. 2396-2398.

Yih, P. et al., "Copper-Matrix Molybdenum Particle Composites Made from Copper Coated Molybdenum Powder," *Journal of Electronic Materials*, 1995, vol. 24, No. 7, pp. 841-850.

Excerpt taken from Touloukian et al., "Thermophysical Properties of Matter, Thermal Expansion: Metallic elements and Alloys," *Plenum*, New York, 1975, vol. 12, 4 pages.

"Coefficients of Linear Expansion of Solids," *Thermal Expansion 2.3.5*, 2 pages.

"Thermal Conductivities of Metallic Elements," *Thermal Conductivities 2.3.7*, 1 page.

* cited by examiner

OPTOELECTRONIC SEMICONDUCTOR DEVICE AND METHOD FOR PRODUCING AN OPTOELECTRONIC SEMICONDUCTOR DEVICE

TECHNICAL FIELD

This disclosure relates to an optoelectronic semiconductor device and a method of producing an optoelectronic semiconductor device.

BACKGROUND

A light-emitting diode (LED) or a semiconductor laser diode usually has a semiconductor layer sequence grown on a substrate. Designs are known in which the semiconductor layer sequence is transferred from the growth substrate to a carrier after the growth process. In this case, use is often made of materials for a carrier which have a coefficient of thermal expansion that deviates from those of the growth substrate and of the semiconductor layer sequence. As a result, during production or during operation of such a device, problems can occur on account of differing thermal expansion of the semiconductor layer sequence and of the carrier in the event of temperature changes.

Particularly metals such as, for instance, electrochemically deposited copper or nickel as materials for a carrier can be problematic since such metals have a considerably higher coefficient of thermal expansion than the semiconductor materials applied thereto. To avoid the problems of the different thermal expansions, in known methods, either such a carrier composed of metal is dispensed with or the risk of different thermal expansions is accepted. Furthermore, it is also known, from a mixture composed of copper and a further metal, to provide a carrier whose thermal expansion is adapted to that of the semiconductor. In the case of arsenide- and phosphide-based semiconductor materials, however, copper can lead to non-radiative recombination. Therefore, it is important to provide diffusion barrier layers or encapsulation layers between the semiconductor layer sequence and a copper-based carrier, which prevent migration of copper into the semiconductor material. However, this leads to an increased material and production outlay.

It could therefore be helpful to provide an optoelectronic semiconductor device having a suitable carrier and a method of producing an optoelectronic semiconductor device.

SUMMARY

We provide an optoelectronic semiconductor device including an optoelectronic semiconductor layer sequence on a metal carrier element, which includes as a first component silver and as a second component a material having a lower coefficient of thermal expansion than silver, wherein the first and second components are intermixed in the metal carrier element.

We also provide a method of producing an optoelectronic semiconductor device including growing an optoelectronic semiconductor layer sequence on a growth substrate, arranging a metal carrier element on a side of the semiconductor layer sequence remote from the growth substrate, wherein the metal carrier element comprises as a first component silver and the coefficient of thermal expansion of the metal carrier element is adapted to the coefficient of thermal expansion of the growth substrate by intermixing the first component with a second component, and at least partly detaching the growth substrate.

We further provide a method of producing an optoelectronic semiconductor device including growing an optoelectronic semiconductor layer sequence on a growth substrate, wherein the growth substrate is composed of GaAs and the optoelectronic semiconductor layer sequence is based on one or more compound semiconductor materials selected from the group consisting of an arsenide and a phosphide compound semiconductor material, arranging a metal carrier element on a side of the semiconductor layer sequence remote from the growth substrate, wherein the metal carrier element comprises as a first component silver and as a second component a material having a lower coefficient of thermal expansion than silver, and the first and second component are intermixed, and at least partly detaching the growth substrate.

DETAILED DESCRIPTION

Figure 1A:
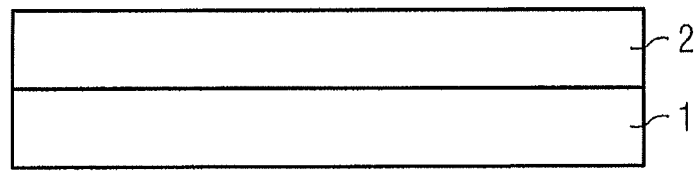
FIGS. 1A to 1D show schematic illustrations of a method of producing an optoelectronic semiconductor device in accordance with one example.

Our optoelectronic semiconductor device may have an optoelectronic semiconductor layer sequence. The optoelectronic semiconductor device can be, for example, a light-emitting diode (LED), a laser diode, a light-receiving or -detecting diode or a solar cell. In particular, the optoelectronic device can in this case be a light-emitting or -receiving or -detecting diode having an emission spectrum or an absorption spectrum in an infrared, visible and/or ultraviolet wavelength range. Furthermore, the optoelectronic component can be an edge or surface emitting laser diode having such an emission spectrum having one or more spectral components in an ultraviolet to infrared wavelength range. If the optoelectronic component is a light-receiving diode or as a solar cell, then it can be provided to receive light having one or more spectral components in the stated wavelength range and convert it into electric current or electrical charges.

In our method of producing an optoelectronic semiconductor device, a growth substrate may be provided on which an optoelectronic semiconductor layer sequence is grown.

The following description relates equally to examples and features which concern the optoelectronic semiconductor device and the method of producing the optoelectronic semiconductor device.

The optoelectronic semiconductor layer sequence may have at least one or a plurality of epitaxially grown semiconductor layers or an epitaxially grown semiconductor layer sequence based on a semiconductor compound material. In particular, the semiconductor compound material can be selected from an arsenide, a phosphide or a nitride compound semiconductor material. By way of example, the semiconductor layer sequence can be a semiconductor chip or part of a semiconductor chip.

The semiconductor layer sequence can be, for example, on the basis of InGaAlN. InGaAlN-based semiconductor chips and semiconductor layer sequences include, in particular, those in which the epitaxially produced semiconductor layer sequence generally has a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$.

Semiconductor layer sequences having at least one active layer on the basis of InGaAlN can, for example, preferably emit or absorb electromagnetic radiation in an ultraviolet to green wavelength range.

Alternatively or additionally, the semiconductor layer sequence or the semiconductor chip can also be based on InGaAlP, that is to say that the semiconductor layer sequence can have different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$.

Semiconductor layer sequences or semiconductor chips having at least one active layer on the basis of InGaAlP can, for example, preferably emit or absorb electromagnetic radiation having one or more spectral components in a green to red wavelength range.

Alternatively or additionally, the semiconductor layer sequence or the semiconductor chip can also comprise other III-V compound semiconductor material systems, for example, an AlGaAs-based material, or II-VI compound semiconductor material systems. In particular, an active layer comprising an AlGaAs-based material can be suitable to emit or absorb electromagnetic radiation having one or more spectral components in a red to infrared wavelength range.

A II-VI compound semiconductor material can comprise at least one element from the second main group such as, for example, Be, Mg, Ca, Sr, and an element from the sixth main group such as, for example O, S, Se. In particular, a II-VI compound semiconductor material comprises a binary, ternary or quaternary compound comprising at least one element from the second main group and at least one element from the sixth main group. In addition, such a binary, ternary or quaternary compound can comprise, for example, one or more dopants and additional constituents. By way of example, the II-VI compound semiconductor materials include: ZnO, ZnMgO, CdS, ZnCdS, MgBeO.

The semiconductor layer sequence can furthermore be deposited on a substrate forming a growth substrate. In this case, the substrate can comprise a semiconductor material, for example a compound semiconductor material system mentioned above. In particular, the substrate can comprise sapphire, GaAs, Ge, GaP, GaN, InP, SiC and/or Si or be composed of such a material.

The semiconductor layer sequence can have as active region, for example, a conventional pn junction, a double heterostructure, a single quantum well structure (SQW structure), or a multiple quantum well structure (MQW structure). The designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures. The semiconductor layer sequence can comprise, alongside the active region, further functional layers and functional regions, for instance p- or n-doped semiconductor layers, undoped or p- or n-doped confinement, cladding or waveguide layers, barrier layers, planarization layers, buffer layers, protective layers and/or electrodes and combinations thereof. Furthermore, one or more mirror layers can be applied, for example, on a side of the semiconductor layer sequence remote from the growth substrate. The structures described here concerning the active region or the further functional layers and regions are known in particular with regard to construction, function and structure and are therefore not explained in any greater detail.

Furthermore, additional layers, for instance buffer layers, barrier layers and/or protective layers can also be arranged perpendicularly to the growth direction of the semiconductor layer sequence, for example, around the semiconductor layer sequence, that is to say for instance on the side areas of the semiconductor layer sequence.

The optoelectronic semiconductor device may have a metal carrier element. Here and hereinafter, the term metal carrier element denotes a carrier element, for example, a carrier substrate which comprises metallic components and is particularly preferably composed of metallic components.

The metal carrier element may be arranged on a side of the semiconductor layer sequence remote from the growth substrate. The semiconductor layer sequence can be arranged, in particular, on a mounting area of the metal carrier element. The arrangement of the metal carrier element on the semiconductor layer sequence can be effected, for example, by a wafer bonding method. For this purpose, on the metal carrier element and/or on the semiconductor layer sequence, it is possible to provide suitable connecting layers, for example, metal or solder layers, by which a permanent connection of the metal carrier element to the semiconductor layer sequence is made possible.

By way of example, the semiconductor layer sequence can be connected to the metal carrier element by a sintering material, in particular by a silver-containing sintering layer. This can be made possible by sintering silver powder. For this purpose, the metal carrier element can have a silver coating as a suitable support.

Furthermore, the metal carrier element can be coated with one or more layers comprising or composed of nickel and/or gold. Layers of this type can be suitable for soldered connections and, for example, also for sintered connections.

The metal carrier element may have on the side remote from the semiconductor layer sequence a silver layer and/or one or more layers comprising nickel and/or gold. As a result, it can be possible to mount the metal carrier element with the semiconductor layer sequence on a carrier element, for example, a circuit board or a housing, for example, by a soldered connection or a sintered connection described above.

The metal carrier element may have a first component which is silver. Silver can be distinguished, in particular, by a high thermal conductivity, similar to copper, wherein, in comparison with copper, silver, at least for some semiconductor materials, can have a smaller disadvantageous effect or else no disadvantageous effect. Furthermore, it can also be possible to prevent migration of silver from the metal carrier element into the semiconductor layer sequence more easily than migration of copper from a copper-containing carrier into a semiconductor layer sequence.

The coefficient of thermal expansion of the metal carrier element may be adapted to the coefficient of thermal expansion of the growth substrate. In comparison with known carriers having a different coefficient of thermal expansion in comparison with the growth substrate and with the semiconductor layer sequence, by adapting the coefficient of thermal expansion of the metal carrier element to the coefficient of thermal expansion of the growth substrate, it is possible to reduce or completely prevent thermal stresses during the production method, in particular during the transfer of the semiconductor layer sequence from the growth substrate to the metal carrier element. Particularly for growth substrates comprising a semiconductor material, that is to say, for example, GaAs or Ge, or for a growth substrate composed of sapphire, the coefficients of thermal expansion of which are similar to the coefficients of thermal expansion of semiconductor layer sequences, therefore, with such metal carrier elements whose coefficients of thermal expansion are adapted to the coefficient of thermal expansion of the growth substrate, it is also possible to prevent thermal stresses during operation of such an optoelectronic semiconductor device. Coefficients of thermal expansion adapted to one another preferably have a difference of less than or equal to 20%, preferably of less than or equal to 10%, and particularly preferably of less than or equal to 5%. It can also be possible for the coefficient of thermal expansion of the metal carrier element to be adapted to the coefficient of thermal expansion of the growth substrate such that the coefficients of expansion differ from one another by less than or equal to 1%. In the case of sapphire as growth substrate, the metal carrier element can be adapted with regard to its coefficient of thermal expansion in this case to the coefficient of thermal expansion of sapphire along the a-axis.

Due to the use of a metal carrier element comprising silver whose coefficient of thermal expansion is adapted to the coefficient of thermal expansion of the growth substrate, the latter can be usable or used in conjunction with semiconductor layer sequences based on a nitride, a phosphide and/or an arsenide compound semiconductor material. In particular, it can be possible to use an identical metal carrier element, that is to say metal carrier elements respectively having an identical composition, as metallic carrier substrate for all these semiconductor materials. Since the thermal and electrical conductivity of silver is at least comparable with or even better than that of copper, the metal carrier elements described here afford, in comparison with conventional copper-based metal carriers, at least equivalent or even better thermal and electrical properties.

In particular, the metal carrier element can be free of copper, where "free of copper" here means that copper was not deliberately supplied during production of the metal carrier element. However, the metal carrier element can contain portions or traces of copper which are technically unavoidable, for example, due to impurities that cannot be removed in starting materials. Consequently, the metal carrier element comprising silver as a first component can constitute a copper-free solution to the problem that a metal carrier element is sought which has properties similar to copper-based carriers with regard to electrical and thermal linking and to which arsenide- and/or phosphide-based semiconductor layer sequences can also be applied, wherein an encapsulation outlay can be kept small in comparison with copper-based carriers, and the semiconductor layer sequence can be transferred to the metal carrier element using the same technology as used when it is transferred to a copper-based carrier.

After the process of arranging the metal carrier element, the growth substrate may be at least partly detached from the semiconductor layer sequence. Depending on the growth substrate used, the detaching process can be effected, for example, by a so-called "laser lift-off" method and/or by etching. Detaching methods for growth substrates are known and will therefore not be described any further.

The metal carrier element may comprise, besides the first component composed of silver, a second component composed of a material having a lower coefficient of thermal expansion than silver. This can make it possible to lower the coefficient of thermal expansion of the metal carrier element in comparison with the coefficient of thermal expansion of silver and thus adapt it to the coefficient of thermal expansion of the growth substrate.

The first component, that is to say the silver, may be substantially insoluble in the second component. This can mean that the first and second components are immiscible or not significantly miscible and that no or hardly any intermetallic compounds composed of the first and second components are formed in the metal carrier element. Here and hereinafter, substantially insoluble and substantially immiscible mean that the first and second components are soluble in one another and miscible with one another to a proportion of less than 1%. In particular, the metal carrier element can be present as a so-called "pseudo-alloy."

At least the first or the second component or both components may be present in granular fashion in the metal carrier element. That means that the first and second components may be provided in pulverulent fashion, for example, and mixed with one another and sintered at sufficiently high temperature. In this case, one of the first and second components can form a matrix, for example, in which the other component is arranged. As an alternative to providing the first and second components in powder form, it is also possible to provide, for example, organometallic starting materials comprising the first and second components, in the case of which a corresponding metal carrier element can be produced by mixing and a precipitation process and a subsequent thermal or heat treatment and sintering. Furthermore, by way of example, the second component can be provided in pulverulent fashion and can be pressed and sintered to form a porous sintering body having a porous structure. The latter serves as a porous skeleton into which the first component, that is to say the silver, can be introduced in liquid form, in particular by infiltration.

The metal carrier element can be produced as a film, in particular as a sintering film with regard to the production procedures described, which film can have an at least partly granular and/or porous structure. By way of example, by the abovementioned production procedures, it is possible to produce a sintering body which is reshaped into a film having a suitable thickness by hot or cold rolling methods.

The metal carrier element may have different coefficients of thermal expansion along a main extension plane and in a direction perpendicular thereto. In this case, the coefficients of thermal expansion of the metal carrier element and of the growth substrate, which are adapted to one another, can respectively be the coefficients of thermal expansion along the respective main extension plane, that is to say in directions parallel to the growth surface in the case of the growth substrate and in directions parallel to the mounting surface in the case of the metal carrier element. The different coefficients of thermal expansion can be produced, for example, during mechanical shaping of the metal carrier element into a film since the area proportions of the first and second components in the main extension plane of the metal carrier element and in a direction perpendicular thereto can form differently during reshaping.

The metal carrier element may have a thickness of greater than or equal to 50 µm. Furthermore, the metal carrier element can have a thickness of less than or equal to 250 µm. Particularly preferably, the thickness can be greater than or equal to 75 µm. In particular, the thickness can be, for example, greater than or equal to 75 µm and less than or equal to 150 µm or else greater than or equal to 150 µm and less than or equal to 250 µm. Furthermore, it can also be possible for the thickness to be greater than or equal to 250 µm.

The second component can be composed of a transition metal, particularly preferably a so-called "refractory" metal. In particular, the second component can comprise a material from the fifth and/or sixth group of the periodic system, that is to say a material from the so-called "vanadium" group and/or the so-called "chromium" group. In particular, the second component can be selected from a group formed by molybdenum, tungsten, chromium, vanadium, niobium and tantalum. Such materials have a lower coefficient of thermal expansion in comparison with silver such that it is possible, by mixing the first component silver and such a second component, to adapt the coefficient of thermal expansion of the metal carrier element to the coefficient of thermal expansion of the growth substrate. While silver has a coefficient of thermal expansion of approximately $19.5 \times 10^{-6}$ $K^{-1}$ at approximately 300 K, the abovementioned materials from the fifth and sixth groups of the periodic system, in particular, have in part significantly lower coefficients of thermal expansion, for example, vanadium approximately $8.4 \times 10^{-6}$ $K^{-1}$, niobium approximately $7.3 \times 10^{-6}$ $K^{-1}$, chromium $4.0 \times 10^{-6}$ $K^{-1}$, tantalum approximately $6.5 \times 10^{-6}$ $K^{-1}$ and in particular molybdenum $5.2 \times 10^{-6}$ $K^{-1}$ and tungsten approximately $4.5 \times 10^{-6}$ $K^{-1}$. Tungsten and molybdenum, in particular, also have a high thermal conductivity, by which, together with the silver as first component, a metal carrier element having a high thermal conductivity can be achieved. The thermal conductivities of vanadium, niobium and chromium lie in the range of 31, 54 and 94 W/(m K) and can therefore also constitute a sufficiently high thermal conductivity.

The second component may be molybdenum or tungsten and the proportion of silver in the metal carrier element may be greater than or equal to 3% by weight and less than or equal to 33% by weight. In such a mixing ratio, the coefficient of thermal expansion of the metal carrier element lies in the range of the coefficients of thermal expansion of gallium arsenide, germanium and, in particular, of sapphire, which can be particularly preferred growth substrates for semiconductor layer sequences.

It is known to increase the thermal expansion of molybdenum or tungsten by admixing copper. Besides increasing the thermal expansion by adding copper, at the same time it is also possible to increase the thermal conductivity, as a result of which the thermal conductivity of molybdenum or tungsten can be improved even further. In comparison with copper-based carriers, the producibility of the metal carrier element described here based on the first component silver and one of the abovementioned second components, for example, molybdenum can be simpler than the production of known molybdenum-copper films since silver has a lower stiffness and a lower melting point in comparison with copper. Furthermore, it can be possible for the encapsulation outlay for a silver-based metal carrier element to be lower in comparison with copper-based carriers. Furthermore, it can also be possible that the first component silver can be stabilized against ambient effects by the second component, for example, molybdenum. If the components silver and molybdenum are provided as organometallic starting materials to produce the metal carrier element, then the temperature for reduction of molybdenum can be lowered in comparison with production of copper-molybdenum films composed of organometallic compounds.

The optoelectronic semiconductor layer sequence may be singulated into individual optoelectronic semiconductor devices after the metal carrier element has been applied on the semiconductor layer sequence. For this purpose, in particular after the process of at least partly detaching the growth substrate, the metal carrier element can be subjected to wet-chemical etching. This can be possible, in particular, by virtue of the fact that silver as first component and, for example, molybdenum as second component can be jointly subjected to wet-chemical etching. The semiconductor layer sequence can be severed, for example, by etching, sawing or laser separation.

Further advantages will become apparent from the examples described below in conjunction with the figures.

In the examples and figures, identical or identically acting constituent parts can be provided in each case with the same reference symbols. The illustrated elements and their size relationships among one another should not be regarded as true to scale, in principle; rather, individual elements such as, for example, layers, components, devices and regions, may be illustrated with exaggerated thickness or size dimensions in order to enable better illustration and/or in order to afford a better understanding.

FIGS. 1A to 1D show a method of producing optoelectronic semiconductor devices 10 in accordance with one example.

For this purpose, in a first method step in accordance with FIG. 1A, a growth substrate 1 is provided on which an optoelectronic semiconductor layer sequence 2 is grown. The growth substrate 1 is composed of GaAs, Ge or sapphire and the optoelectronic semiconductor layer sequence 2 is based on an arsenide, a phosphide and/or a nitride compound semiconductor material, which have been described above in the general part. In this case, the optoelectronic semiconductor layer sequence 2 can be grown with one or more active layers that generates radiation or detects radiation such that the optoelectronic semiconductor devices 10 (see FIG. 1D) that can be produced by the method described can be light-emitting diodes, edge or surface emitting laser diodes, light-receiving diodes or solar cells.

The optoelectronic semiconductor layer sequences 2 furthermore comprise electrode layers and, for example, also on the top side remote from the growth substrate 1, at least one mirror layer.

Figure 1B:
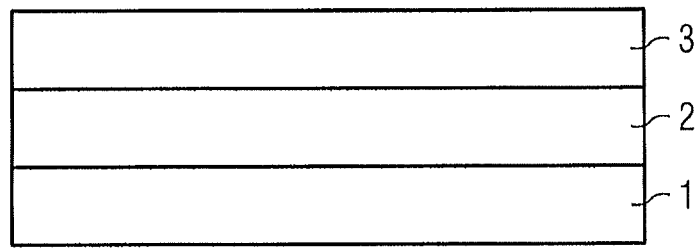

In a further method step in accordance with FIG. 1B, a metal carrier element 3 is arranged on the semiconductor layer sequence 2. The metal carrier element 3 comprises silver as a first component and molybdenum or tungsten as a second component. As an alternative thereto, the metal carrier element 3 can also comprise one of the further materials mentioned above in the general part for the second component.

To provide the metal carrier element 3, the first and second components are provided, for example, as powders or in the form of organometallic compounds, mixed with one another, if appropriate reduced and sintered under the action of pressure. As an alternative thereto, it is also possible to produce the second component as a porous sintering body and introduce the first component in liquid form by infiltration. In particular, the metal carrier element 3 is a film, in particular a sintering film, for example, by rolling methods. In this case, one of the two components forms a matrix in which the other component is arranged. In particular, the two components can be granular in the metal carrier element 3.

The thickness of the metal carrier element 3 is preferably greater than or equal to 50 μm and less than or equal to 250 μm, and particularly preferably greater than or equal to 75 μm and less than or equal to 150 μm. As an alternative thereto, the thickness can also be greater than or equal to 150 μm and less than or equal to 250 μm.

One or more connecting layers are applied on the metal carrier element 3 and/or on the semiconductor layer sequence 2 prior to joining together, by which connecting layers a permanent connection between the metal carrier element 3 and the semiconductor layer sequence 2 can be achieved by the action of pressure and/or heat. The one or more connecting layers can comprise, for example, one or more metal layers, in particular solder layers. As an alternative thereto, the semiconductor layer sequence 2 can connect to the metal carrier element 3, for example, by a silver-containing sintering material. This can be made possible by sintering silver powder. For this purpose, it is possible to apply to the metal carrier element 3 a silver coating or else one or more layers comprising or composed of nickel and/or gold. Such layers can produce reliable soldering connections and sintering connections.

Figure 1C:
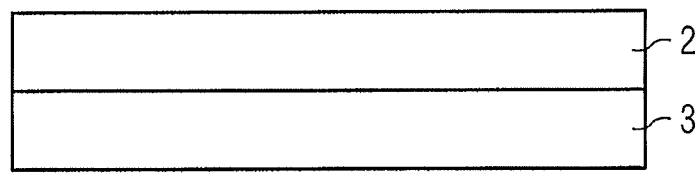

In accordance with a further example in accordance with FIG. 1C, the growth substrate 1 is detached from the semiconductor layer sequence 2. As an alternative to the complete detachment of the growth substrate 1 as shown, the latter can also be only partly detached such that part of the growth substrate can remain on the semiconductor layer sequence 2. The growth substrate 1 can be detached, for example, by an etching method or by a laser lift-off method.

Figure 1D:
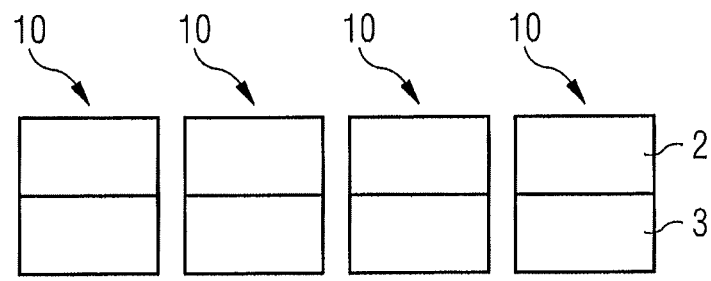

In a further method step in accordance with FIG. 1D, the semiconductor layer sequence 2 on the metal carrier element 3 is singulated to form individual optoelectronic semiconductor devices 10. In this case, the metal carrier element 3 can be severed by wet-chemical etching, particularly in the case of silver as first component and molybdenum as second component.

After detachment of the growth substrate 1 and/or after singulation, further layers, for example, electrode layers, passivation layers and/or optical coupling-out layers, can be applied on that side of the semiconductor layer sequence 2 remote from the metal carrier element 3.

On the side remote from the semiconductor layer sequence 2, the metal carrier element 3 can furthermore also be provided with a silver layer and/or one or more layers comprising nickel and/or gold. As a result, the metal carrier element 3 with the semiconductor layer sequence 2 can be applied on a carrier element, for example, a circuit board or a housing, for example, by a soldering connection or a sintering connection described above.

An optoelectronic semiconductor device 10 produced in this way can be, for example, a thin-film light-emitting diode chip or thin-film laser diode chip.

A thin-film light-emitting diode chip or a thin-film laser diode chip is distinguished by at least one of the following characteristic features:
- a reflective layer is applied or formed at a main area-facing toward the carrier element, in particular the metal carrier element described here—of the radiation-generating semiconductor layer sequence, which is a radiation-generating epitaxial layer sequence, in particular, the reflective layer reflecting at least part of the electromagnetic radiation generated in the semiconductor layer sequence back into the latter;
- the thin-film light-emitting diode chip has a carrier element, in particular the metal carrier element described here, which is not the growth substrate on which the semiconductor layer sequence was grown epitaxially, but rather a separate carrier element which was subsequently fixed to the semiconductor layer sequence;
- the semiconductor layer sequence has a thickness of 20 μm or less, in particular 10 μm or less;
- the semiconductor layer sequence is free of a growth substrate. In this case, "free of a growth substrate" means that a growth substrate possibly used for growth is removed from the semiconductor layer sequence or at least greatly thinned. In particular, it is thinned such that it is not self-supporting by itself or together with the semiconductor layer sequence alone. The remaining residue of the greatly thinned growth substrate is in particular unsuitable as such for the function of a growth substrate; and
- the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behaviour.

A basic principle of a thin-film light-emitting diode chip is described, for example, in I. Schnitzer et al., Appl. Phys. Lett. 63 (16) 18 Oct. 1993, pages 2174-2176, the subject matter of which is hereby incorporated by reference. Examples of thin-film light-emitting diode chips are described in EP 0905797 A2 and WO 02/13281 A1, the subject matter of which is incorporated by reference.

In the method described here, the metal carrier element 3 is adapted with regard to its coefficient of thermal expansion to the coefficient of thermal expansion of the growth substrate 1. For this purpose, a mixing ratio of the first and second components, that is to say preferably as described in the example shown, of silver as a first component and molybdenum or tungsten as a second component, is chosen such that the thermal expansion of silver is reduced by addition of the second component, or the coefficient of thermal expansion of the second component is increased by addition of silver such that the coefficient of thermal expansion of the finished metal carrier element 3 corresponds or at least comes very close to that of the growth substrate 1, that is to say in particular, for example, gallium arsenide, germanium or sapphire in the example shown. In particular, deviation of the coefficient of thermal expansion of the growth substrate 1 and of the metal carrier element 3 can be less than or equal to 10% and preferably less than or equal to 5%. Depending on the mixing ratio and intermixing of the components, the first component or the second component can form a continuous matrix in which the other component is incorporated in granular fashion. In the case of silver as a first component and molybdenum as a second component, for example, silver grains can form a continuous matrix in which the molybdenum grains are incorporated separately, or it can also be possible that silver grains fill the interspaces in a dense packing of molybdenum grains. For adaptation to the thermal expansion of gallium arsenide ($5.74 \times 10^{-6}$ $K^{-1}$ at 300 K) or sapphire (along the a-axis: $6.64 \times 10^{-6}$ $K^{-1}$ at 300 K) or germanium, having a coefficient of thermal expansion similar to sapphire, it is necessary to choose an appropriate amount of the first component silver with respect to the second component. In this case, the exact amount should best be determined experimentally since the powder-metallurgical processing can have an influence on the morphology and, hence, under certain circumstances, also on the thermal expansion properties.

Figure 2:
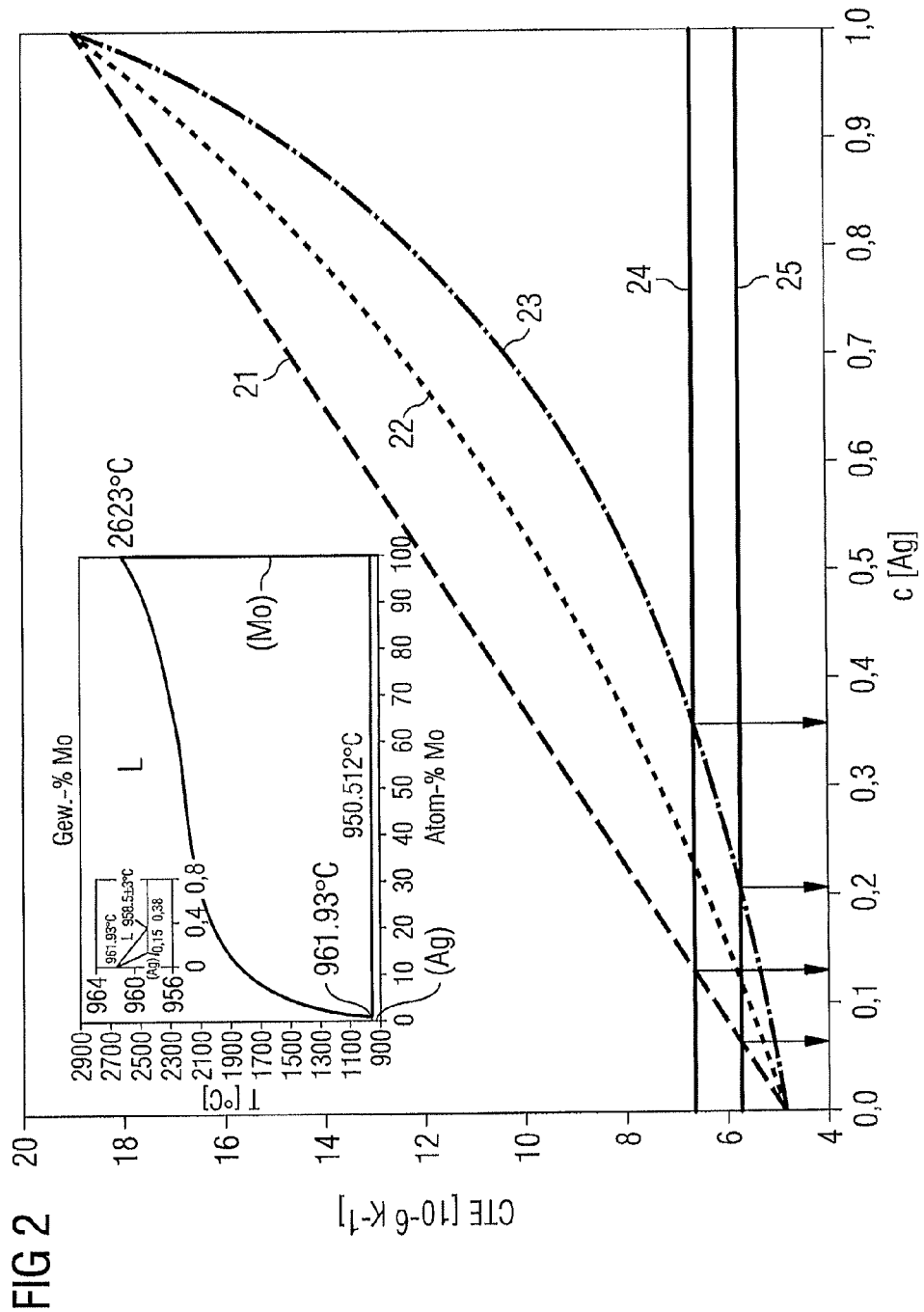
FIGS. 2 and 3 show coefficients of thermal expansion for metal carrier elements and for growth substrates and metals in accordance with further examples.

In this connection, the coefficient of thermal expansion CTE in $10^{-6}$ $K^{-1}$ for metal carrier elements comprising the first component silver and the second component molybdenum as a function of the proportion by mass c(Ag) of silver is shown in conjunction with FIG. 2.

FIG. 2 shows theoretical curves 21, 22 and 23, which indicate according to different models the coefficient of thermal expansion of a mixture of silver and molybdenum as a function of the silver content in per cent by weight. In this case, curve 21 corresponds to a Vegard model in which the respective coefficients of thermal expansion of silver and molybdenum are linearly weighted with the respective proportion thereof. Curves 22 and 23 correspond to further models described in V. B. Rapkin and R. F. Koziova, "Powder Metallurgy and Metal Ceramics", Vol. 7(3), 1968, pages 210-215 (translation from Poroshkovaya Metallurgiya, No. 3(63), 1968, pages 64-70), wherein curve 23 corresponds to the model by Turner described in that publication in accordance with reference [10] cited there. The horizontal lines 24 and 25 and the linear indicate the coefficients of thermal expansion of sapphire (reference symbol 24) and GaAs (25). From the points of intersection of the lines 24 and 25 with curves 21 and 23, a proportion of the component silver in a range of greater or equal to 3 and less than or equal to 33% results. In particular, in the case of a growth substrate 1 composed of GaAs, a suitable proportion of silver in the range of greater than or equal to 3% and less than or equal to approximately 20.5% results, while for a growth substrate 1 composed of sapphire a suitable proportion of silver in a range of approximately 11.5% to 33% results. Similar values hold true for a growth substrate composed of germanium.

By measuring the coefficient of thermal expansion of metal carrier elements comprising a proportion of silver in the stated ranges, depending on metallurgical processing, that is to say depending on the production method chosen for the metal carrier element 3, it is possible to determine the appropriate composition for a growth substrate composed of GaAs, Ge or sapphire or one of the further materials mentioned in the general part.

The additional graph (taken from: Massalski, "Binary Alloy Phase Diagrams", ASM International) included as an insert in the graph in FIG. 2 shows the phase diagram of the binary system silver-molybdenum which reveals the immiscibility of the two metals in the solid state. In particular, silver has in molybdenum a solubility of just 0.15 atomic per cent at the eutectic point.

Figure 3:
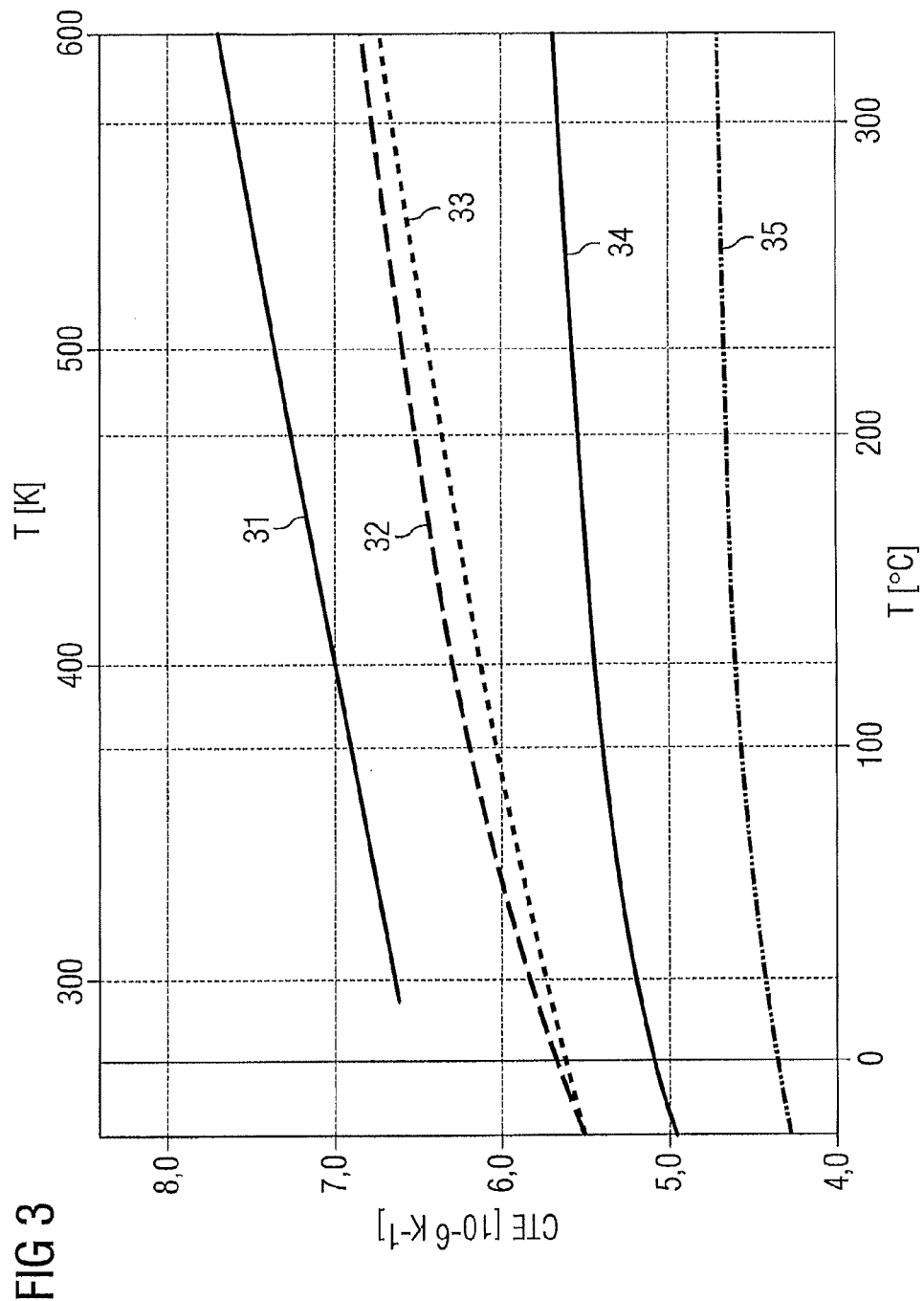

FIG. 3 shows the coefficients of thermal expansion CTE as a function of the temperature T for a-sapphire (reference symbol 31), germanium (reference symbol 32), GaAs (reference symbol 33), which are particularly suitable as growth substrates. Furthermore, the coefficients of thermal expansion CTE for molybdenum (reference symbol 34) and tungsten (reference symbol 35) are shown purely by way of example (described, for example, in Touloukian et al., "Thermophysical properties of matter, Thermal Expansion: Metallic Elements and Alloys", Vol. 12, Plenum, N.Y., 1975). Since silver has a higher coefficient of thermal expansion than molybdenum and tungsten, it is possible to obtain as described above, metal carrier elements whose coefficient of thermal expansion can be adapted to the coefficient of thermal expansion of the growth substrate respectively used.

Our devices and methods are not restricted to the examples by the description on the basis of those examples. Moreover, this disclosure encompasses any novel feature and also any combination of features which in particular includes any combination of features in the appended claims, even if the feature or combination itself is not explicitly specified in the claims or examples.

The invention claimed is:

1. An optoelectronic semiconductor device comprising an optoelectronic semiconductor layer sequence on a metal carrier element, which comprises as a first component silver and as a second component a material having a lower coefficient of thermal expansion than silver, wherein the first and second components are intermixed in the metal carrier element and the silver is substantially insoluble in the second component.

2. An optoelectronic semiconductor device comprising an optoelectronic semiconductor layer sequence on a metal carrier element, which comprises as a first component silver and as a second component a material having a lower coefficient of thermal expansion than silver, wherein the first and second components are intermixed in the metal carrier element and the coefficient of thermal expansion of the metal carrier element is adapted to the coefficient of thermal expansion of sapphire, germanium or GaAs.

3. An optoelectronic semiconductor device comprising an optoelectronic semiconductor layer sequence on a metal carrier element film, which comprises as a first component silver and as a second component a material having a lower coefficient of thermal expansion than silver, wherein the first and second components are intermixed in the metal carrier element.

4. An optoelectronic semiconductor device comprising an optoelectronic semiconductor layer sequence on a metal carrier element having a thickness of greater than or equal to 50 µm and less than or equal to 250 µm which comprises as a first component silver and as a second component a material having a lower coefficient of thermal expansion than silver, wherein the first and second components are intermixed in the metal carrier element.

5. A method of producing an optoelectronic semiconductor device comprising:
   growing an optoelectronic semiconductor layer sequence on a growth substrate,
   arranging a metal carrier element on a side of the semiconductor layer sequence remote from the growth substrate, wherein the metal carrier element comprises as a first silver component and the coefficient of thermal expansion of the metal carrier element is adapted to the coefficient of thermal expansion of the growth substrate by intermixing the first component with a second component, and
   at least partly detaching the growth substrate,
   wherein the metal carrier element comprises as the first component the silver and as the second component a material having a lower coefficient of thermal expansion than silver, and
   wherein the second component is sintered to form a porous sintering body and the first component is introduced in liquid form into the sintering body.

6. A method of producing an optoelectronic semiconductor device comprising:
   growing an optoelectronic semiconductor layer sequence on a growth substrate,
   arranging a metal carrier element on a side of the semiconductor layer sequence remote from the growth substrate, wherein the metal carrier element comprises as a first silver component and the coefficient of thermal expansion of the metal carrier element is adapted to the coefficient of thermal expansion of the growth substrate by intermixing the first component with a second component, and
   at least partly detaching the growth substrate,
   wherein the metal carrier element comprises as the first component the silver and as the second component a material having a lower coefficient of thermal expansion than silver, and
   wherein the growth substrate is sapphire, the second component is molybdenum or tungsten, and the proportion of the first component in the metal carrier element is greater than or equal to 3% by weight and less than or equal to 33% by weight.

7. The method of producing an optoelectronic semiconductor device comprising:
   growing an optoelectronic semiconductor layer sequence on a growth substrate,
   arranging a metal carrier element on a side of the semiconductor layer sequence remote from the growth substrate, wherein the metal carrier element comprises as a first silver component and the coefficient of thermal expansion of the metal carrier element is adapted to the coefficient of thermal expansion of the growth substrate by intermixing the first component with a second component, and after at least partly detaching the growth substrate, wherein, after at least partly detaching the growth substrate, the metal carrier element is subjected to wet-chemical etching to singulate the semiconductor layer sequence into a plurality of optoelectronic devices.

8. A method of producing an optoelectronic semiconductor device comprising:

growing an optoelectronic semiconductor layer sequence on a growth substrate, wherein the growth substrate is composed of GaAs and the optoelectronic semiconductor layer sequence is based on one or more compound semiconductor materials selected from the group consisting of an arsenide and a phosphide compound semiconductor material, arranging a metal carrier element film on a side of the semiconductor layer sequence remote from the growth substrate, wherein the metal carrier element comprises as a first component silver and as a second component a material having a lower coefficient of thermal expansion than silver, and the first and second component are intermixed, and at least partly detaching the growth substrate, wherein the metal carrier element is a film.

9. A method of producing an optoelectronic semiconductor device comprising:

growing an optoelectronic semiconductor layer sequence on a growth substrate, wherein the growth substrate is composed of GaAs and the optoelectronic semiconductor layer sequence is based on one or more compound semiconductor materials selected from the group consisting of an arsenide and a phosphide compound semiconductor material, arranging a metal carrier element on a side of the semiconductor layer sequence remote from the growth substrate, wherein the metal carrier element comprises as a first component silver and as a second component a material having a lower coefficient of thermal expansion than silver, and the first and second component are intermixed, and at least partly detaching the growth substrate, wherein the metal carrier element has a thickness of greater than or equal to 50 μm and less than or equal to 250 μm.

10. A method of producing an optoelectronic semiconductor device comprising:

growing an optoelectronic semiconductor layer sequence on a growth substrate, wherein the growth substrate is composed of GaAs and the optoelectronic semiconductor layer sequence is based on one or more compound semiconductor materials selected from the group consisting of an arsenide and a phosphide compound semiconductor material, arranging a metal carrier element on a side of the semiconductor layer sequence remote from the growth substrate, wherein the metal carrier element comprises as a first component silver, and as a second component a material having a lower coefficient of thermal expansion than silver, and the first and second component are intermixed, and at least partly detaching the growth substrate, wherein the second component is selected from the group consisting of vanadium, niobium and tantalum.

11. The optoelectronic semiconductor device according to claim 1, wherein the second component is selected from the group consisting of molybdenum, tungsten, chromium, vanadium, niobium and tantalum.

12. The optoelectronic semiconductor device according to claim 1, wherein the optoelectronic semiconductor layer sequence is based on one or more compound semiconductor materials selected from the group consisting of an arsenide, a phosphide and a nitride compound semiconductor material.

13. The method according to claim 5, wherein the second component is selected from the group consisting of molybdenum, tungsten, chromium, vanadium, niobium and tantalum.

14. The method according to claim 5, wherein the metal carrier element is produced by sintering the first and second components.

15. The method according to claim 5, wherein the growth substrate is composed of sapphire, germanium or GaAs.

* * * * *